United States Patent
Ho et al.

(10) Patent No.: US 6,996,459 B2
(45) Date of Patent: Feb. 7, 2006

(54) METHOD AND APPARATUS FOR PREVENTING A FURNACE IN A SEMICONDUCTOR PROCESS FROM TEMPERATURE AND GAS EXCURSION

(75) Inventors: Ta Neng Ho, Chungho (TW); Chung Pin Lin, Hsinchu (TW); Lin Wu Yang, Taichung (TW); Chung Chih Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/871,535

(22) Filed: Jun. 21, 2004

(65) Prior Publication Data

US 2005/0004698 A1    Jan. 6, 2005

(30) Foreign Application Priority Data

Jun. 27, 2003    (TW) ............................... 92117620 A

(51) Int. Cl.
G05D 23/00    (2006.01)
G06F 19/00    (2006.01)

(52) U.S. Cl. ..................... 700/300; 700/121
(58) Field of Classification Search .............. 700/108, 700/117–121, 299, 300; 438/5, 14, 795
See application file for complete search history.

(56) References Cited

U.S. PATENT DOCUMENTS

| | | | | |
|---|---|---|---|---|
| 5,273,424 A | * | 12/1993 | Kobayashi | 432/241 |
| 5,291,514 A | * | 3/1994 | Heitmann et al. | 373/135 |
| 5,746,591 A | * | 5/1998 | Yao | 432/241 |
| 5,759,499 A | * | 6/1998 | Bourdet et al. | 422/199 |
| 5,875,416 A | * | 2/1999 | Kanno | 702/130 |
| 6,246,031 B1 | * | 6/2001 | Yoo | 219/390 |
| 6,703,592 B2 | * | 3/2004 | Van Bilsen | 219/497 |

* cited by examiner

*Primary Examiner*—Maria N. Von Buhr
(74) *Attorney, Agent, or Firm*—Rabin & Berdo, P.C.

(57) ABSTRACT

To prevent a furnace in a semiconductor process from temperature and gas excursion, a paddle and spike thermal couples arranged on the sidewall of the tube and adjacent to the heater, respectively, are connected to a temperature controller to regulate the heater, and a mass controller adjusts the gas flow injected to the tube. In the method, the spike thermal couple, peddle thermal couple and zero point of the mass flow controller are checked to maintain within a first and second temperature ranges and a first gas flow speed range, respectively, and after wafers are loaded and temperature is ramped up, the peddle thermal couple and mass flow controller are checked again to maintain within a third temperature range and second gas flow speed range.

8 Claims, 3 Drawing Sheets

METHOD AND APPARATUS FOR PREVENTING A FURNACE IN A SEMICONDUCTOR PROCESS FROM TEMPERATURE AND GAS EXCURSION

FIELD OF THE INVENTION

The present invention relates generally to a semiconductor process and apparatus and, more particularly, to a method and apparatus for preventing a furnace in a semiconductor process from temperature and gas excursion.

BACKGROUND OF THE INVENTION

Furnace with quartz tube is an essential apparatus for semiconductor process, which is used for oxidation, deposition and heat treatment, and in such processes the temperature and gas flow are two most importance parameters for the process to determine the yield of the process. However, it is not easy to control the temperature and gas flow in a furnace, because they are furnace dependent and need to be adjusted by experience. For gas flow control, the gas flow applied in the main step depends on the reading of mass flow controller (MFC), and the accuracy of the reading is related to the zero point of the MFC before the running of the main step. It is easy for operators to neglect the zero point of MFC, and when the zero point drifts too much from the setting point, it is not possible to achieve the appropriate process parameter by only using the MFC in the main step. Moreover, to control the temperature in the furnace is even more difficult, because heater is used for heat source in furnace, and during process running it is necessary to ramp up the temperature and control the heater. Unfortunately, the temperature of the heater itself cannot represent the temperature in the tube of the furnace directly. Although it is possible to place a thermal couple (TC) on the sidewall of the quartz tube to monitor the temperature, once the reading of the paddle TC arranged on the sidewall of the tube is rising or reducing to a certain value, the control of the heater is always far away from the appropriate working point. If the paddle TC is out of order, the information of reacting temperature won't be correct and the outcome would be even worse. Unfortunately, the inaccuracy occurred in the temperature control and/or gas flow control cannot be found immediately during process running, and it is thus impossible to avoid the cost waste by finding the process abnormal in the checking of wafers after the process finished, and additional process many needed to remove the product on the wafers thereafter, sometime even need to scrap wafers. The furnace process needs dynamic stability and accurate control, and over relying on operators and their experience easily causes excursion. Automatic control will increases the reliability and prevents the process from excursion, thereby improves the yield and reduces the costs.

SUMMARY OF THE INVENTION

Accordingly, an object of the present invention is to provide a method and apparatus for preventing a furnace in a semiconductor process from temperature and gas excursion. In the method and apparatus, according to the present invention, thermal couples are arranged on the tube of the furnace and close to the heater outside the tube to provide temperature signals to a temperature controller, a mass flow controller is used to control the gas flow injected to the tube. Before loading wafers to the tube, the heater and tube are checked if their temperatures are within the appropriate range, respectively, and the zero point of the mass flow controller is also checked if it is within the appropriate range. After ramping up the temperature, the temperature of the tube is monitored and controlled within the appropriate range, and the reading of the mass flow controller is also controlled in the appropriate range.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
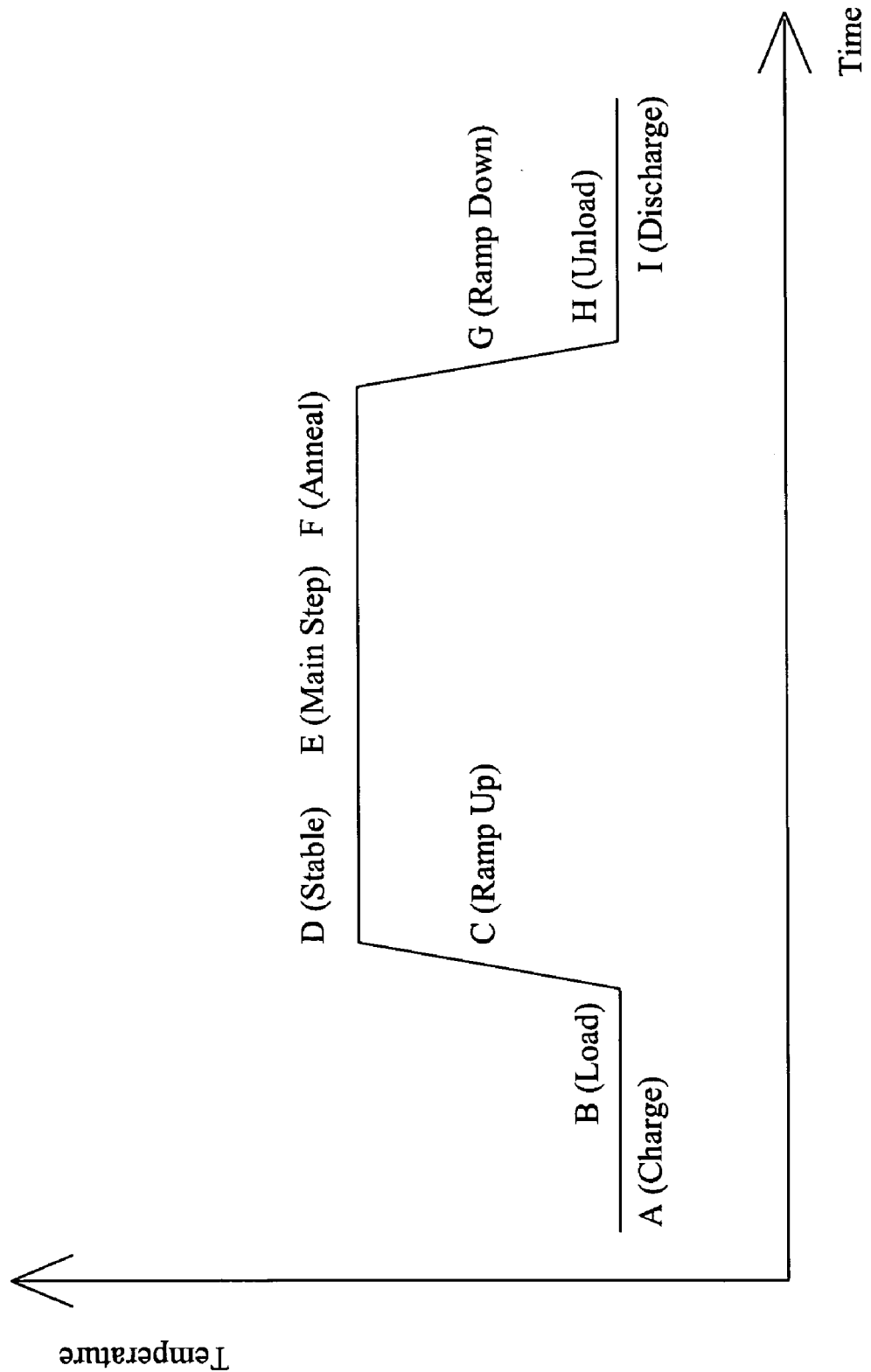
FIG. 1 shows a flow chart of an embodiment process according to present invention.
Figure 2:
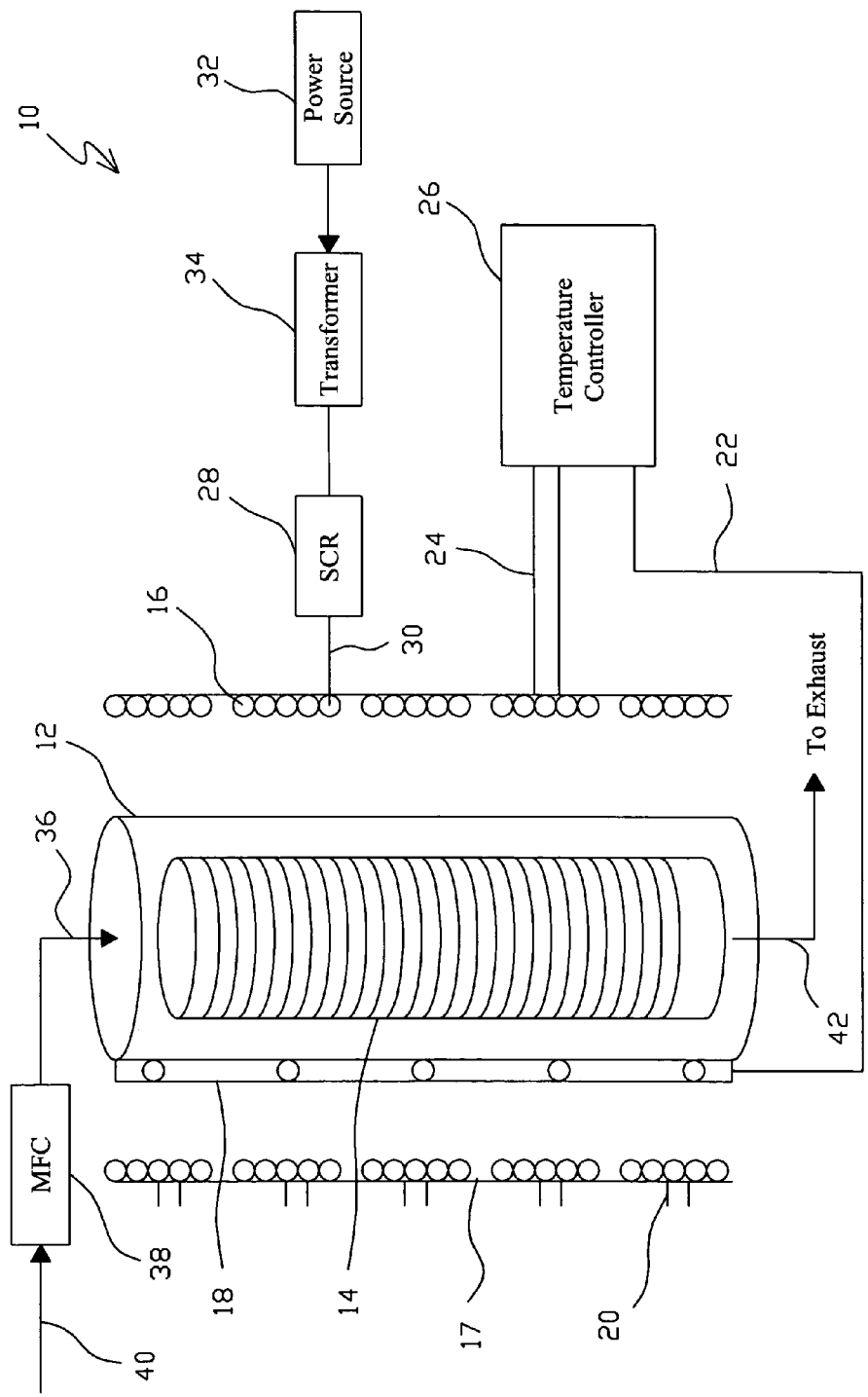
FIG. 2 shows an embodiment apparatus to perform the process shown in FIG. 1.

FIG. 1 shows a procedure in a semiconductor process that employs a furnace, such as oxidation and deposition, and FIG. 2 shows an apparatus to perform the process. As shown in FIG. 1, the process can be divided into three regions according to the temperature. In step A for the charge procedure, the furnace should be kept in an appropriate temperature, and the gas flow should be also kept in a fixed value which is set for the zero point. The conditions at this step A are used for the preparation state, and then wafers are loaded in step B, followed with step C to ramp up the temperature to a target value at a certain speed by dramatically increasing the heating power. In step D is to wait for the temperature and gas flow to be stable in the appropriate value to complete the process preparation. In step E, the gas is adjusted to inject to the furnace and start the main step, after which is optionally step F for annealing. Then in step G, the heating power is reduced to ramp down the temperature to a relative low temperature at a certain speed, followed with step H to unload the wafers and step I to discharge. As shown in FIG. 2, an apparatus 10 for the process described above comprises a tube 12 to positioned with a boat 14 carrying the wafers 14 thereinside, a heater 16 arranged outside and coiling the tube 12, an outer wall 17 for thermal insulation improvement, a paddle TC 18 arranged on the sidewall of the tube 12 axially to monitor the temperature profile of the tube 12, a spike TC 20 arranged close to the heater 16 to monitor its temperature. The TCs 18 and 20 provide temperature signals 22 and 24, respectively, to a temperature controller 26 which is usually a microcontroller to operate a silicon controlled rectifier (SCR) 28 to generate a control signal 30 to regulate the heater 16 in its power, and a power source 32 provides the power to the SCR 28 through a transformer 34. On the other hand, a gas 36 is injected from a gas inlet 40 to the top of the tube 12 under the control of a MFC 38 and the gas passing through the tube 12 is exhausted from an outlet 42 at the bottom of the tube 12.

Figure 3:
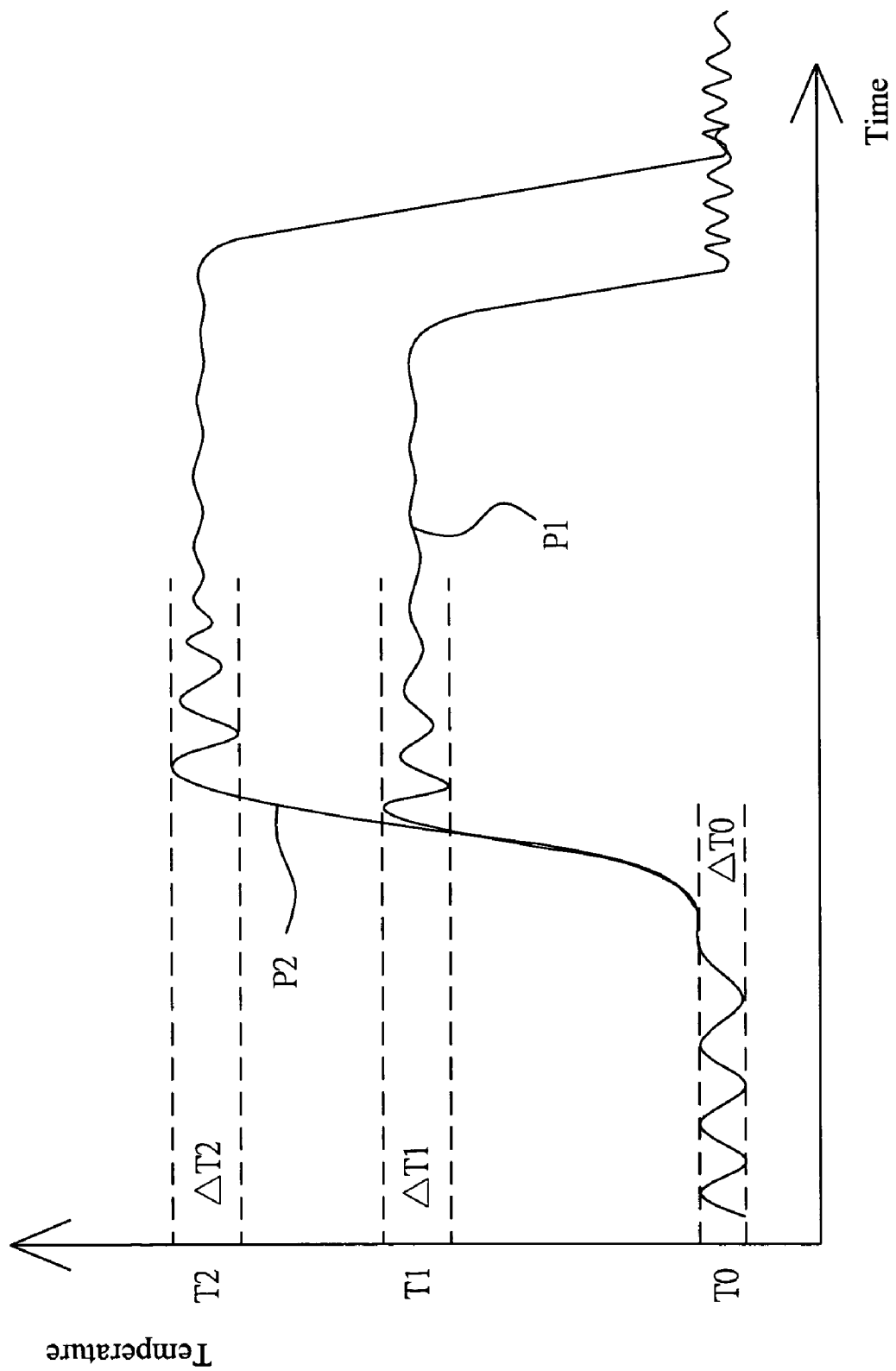
FIG. 3 shows two temperature curves for two processes with different setting temperatures.

The major inventive monitoring and controlling are performed during the preparation state before the wafers are loaded and during the stabilizing state. FIG. 3 shows two temperature curves for two processes with different setting temperatures. When process P1 is in the charging step, the setting temperature T0 of the tube 12 is around 400° C., and before loading the wafers, it is necessary to keep the temperature of the tube 12 and the heat supply of the heater 16 stable, meanwhile using the temperature signal 24 from the TC 20 to check if the temperature of the heater 16 falls in the setting temperature range or not, of which the range is ±5° C. of the setting point, then using the temperature signal 22 from the TC 18 to check if the temperature of the tube 12 falls in the setting temperature range or not, of which the range is also ±5° C. of the setting point, at the same time the zero point of MFC 38 is checked and it's value is ±1% of the setting point. The purpose of this procedure is to ensure the reference point of the process is under the setting conditions and accurate enough. Moreover, alternatively checking the inner TC 18 and outer TC 20 in turns is to ensure the consistence of the monitoring apparatus and get better control. After ramping up the temperature, for example 800° C. for the setting temperature of the tube, it is checked whether the temperature of the TC 18 falls in the setting range which is ±10° C. of the setting point, and the power of the heater 16 is adjusted according to the checked value. Simultaneously, the MFC 38 is controlled for its reading in ±5% of the working point, and when the machine is stable, the gas is injected to run the main step, followed with procedures same as those in prior arts. The control for another process P2 is similar, although the temperature for its main step is higher than that of process P1, and thus the steps before wafers loading and after temperature ramping up are performed by the same way to control. The inventive scheme is nothing to do with the condition of the main step, but a better checking procedure that prevents the furnace in a semiconductor process from temperature and gas excursion before the main step.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for preventing temperature and gas excursions in a furnace during semiconductor processing, said furnace having a tube and a heater coiled around said tube, said tube having a sidewall monitored by a first thermal couple and being injected with a gas flow thereto by a mass flow controller, said heater being monitored by a second thermal couple and regulated by a temperature controller responsive to said first and second thermal couples, said method comprising the steps of:
    checking whether said second thermal couple is in a first temperature range;
    checking whether said first thermal couple is in a second temperature range;
    checking whether a zero point of said mass flow controller is in a first gas flow speed range;
    loading wafers into said tube;
    ramping up a temperature of said tube;
    checking whether said first thermal couple is in a third temperature range; and
    checking whether said mass flow controller is in a second gas flow speed range.

2. A method according to claim 1, wherein said first temperature range is ±5° C. around a setting temperature.

3. A method according to claim 1, wherein said second temperature range is ±5° C. around a setting temperature.

4. A method according to claim 1, wherein said first gas flow speed range is ±1% around said zero point.

5. A method according to claim 1, wherein said third temperature range is ±10° C. around a setting temperature.

6. A method according to claim 1, wherein said second gas flow speed range is ±1% around a setting point.

7. An apparatus for preventing temperature and gas excursions in a furnace during semiconductor processing, said furnace having a tube for performing a main step, said apparatus comprising:
    a heater coiling around said tube;
    a first thermal couple arranged on a sidewall of said tube for generating a first temperature signal;
    a second thermal couple arranged adjacent to said heater for generating a second temperature signal;
    a temperature controller for regulating said heater responsive to said first and second temperature signals; and
    a mass flow controller for controlling a gas flow injected into said tube;
    wherein before said main step, a gas flow zero point is adjusted within a predetermined gas flow speed range, and said first and second thermal couples are adjusted within a first and second temperature ranges, respectively.

8. An apparatus according to claim 7, wherein said temperature controller checks said first and second temperature signals in turn.

* * * * *